United States Patent
Benedix et al.

(10) Patent No.: US 12,163,981 B2
(45) Date of Patent: Dec. 10, 2024

(54) CONTACT PIN WITH INDIVIDUALLY MOVABLE CONTACT ELEMENTS

(71) Applicant: Feinmetall GmbH, Herrenberg (DE)

(72) Inventors: Lutz Benedix, Herrenberg (DE); Jörg Burgold, Herrenberg (DE)

(73) Assignee: Feinmetall GmbH, Herrenberg (DE)

( * ) Notice: Subject to any disclaimer, the term of this patent is extended or adjusted under 35 U.S.C. 154(b) by 116 days.

(21) Appl. No.: 17/843,209

(22) Filed: Jun. 17, 2022

(65) Prior Publication Data
US 2022/0317154 A1    Oct. 6, 2022

Related U.S. Application Data

(63) Continuation of application No. PCT/EP2020/086909, filed on Dec. 17, 2020.

(30) Foreign Application Priority Data

Dec. 19, 2019   (DE) .......................... 102019220311.6

(51) Int. Cl.
    *G01R 1/067*   (2006.01)
(52) U.S. Cl.
    CPC ..... *G01R 1/06738* (2013.01); *G01R 1/06722* (2013.01)
(58) Field of Classification Search
    CPC ............ G01R 1/06738; G01R 1/06722; G01R 1/07364
    (Continued)

(56) References Cited

U.S. PATENT DOCUMENTS

| | | | | |
|---|---|---|---|---|
| 4,686,465 A | * | 8/1987 | Kruger | H01R 12/714<br>439/482 |
| 4,701,702 A | * | 10/1987 | Kruger | H01R 11/18<br>324/755.05 |

(Continued)

FOREIGN PATENT DOCUMENTS

| | | |
|---|---|---|
| DE | 102012111633 A1 | 6/2013 |
| EP | 3156805 A1 | 4/2017 |

(Continued)

OTHER PUBLICATIONS

Translation of KR 101451319 (Year: 2014).*

(Continued)

*Primary Examiner* — Christopher P McAndrew
(74) *Attorney, Agent, or Firm* — Sheppard Mullin Richter & Hampton LLP

(57) ABSTRACT

The invention relates to a contact device (1) for contacting an electrical contact point of a test object, comprising a contact plunger (3), which has a plunger shaft (4) for mounting in a guide sleeve (2) in an axially displaceable manner as well as a contact head (5) which is assignable to the test object and arranged on a free end of the plunger shaft (4), and comprising at least one contact element (13), which is movably mounted on and/or in the contact head (5), whereby at least one spring element (6), which is elastically deformable against its spring force by means of the contact element (13) under a load resulting from a contact, is assigned to the contact element (13), is provided that several of the contact elements (13), which in each case have a contact area (14) for contacting, are arranged next to one another on the contact head (5) in such a way that the contact areas (14) form an at least essentially continuous contact surface (15) of the contact head (5) for the contact point in the unloaded state.

17 Claims, 3 Drawing Sheets

Figure 1:
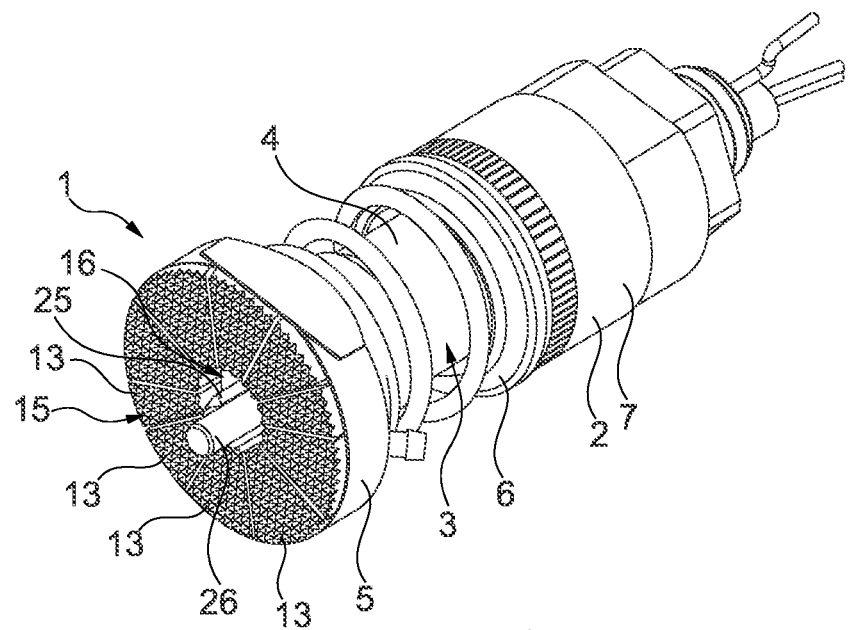

(58) Field of Classification Search
USPC .................................................... 324/755.05
See application file for complete search history.

(56) References Cited

U.S. PATENT DOCUMENTS

| | | | | |
|---|---|---|---|---|
| 4,707,655 A | * | 11/1987 | Kruger .................... | G01R 1/067 324/763.01 |
| 4,814,697 A | * | 3/1989 | Kruger ............... | G01R 1/06722 324/755.05 |
| 4,897,043 A | * | 1/1990 | Giringer ............ | G01R 1/06722 439/482 |
| 4,918,384 A | * | 4/1990 | Giringer ................ | H01R 11/18 324/755.05 |
| 9,128,120 B2 | * | 9/2015 | Lee .................... | G01R 1/06722 |
| 2010/0289515 A1 | | 11/2010 | Kiriki | |
| 2017/0248659 A1 | | 8/2017 | Choi et al. | |

FOREIGN PATENT DOCUMENTS

| | | | |
|---|---|---|---|
| JP | 2014-146504 A | 8/2014 |
| KR | 10-2014-0067227 A | 6/2014 |
| KR | 101451319 B1 | 10/2014 |
| KR | 10-2018-0067229 A | 6/2018 |
| WO | 2019/022391 A1 | 1/2019 |

OTHER PUBLICATIONS

International Search Report and Written Opinion for PCT/EP2020/086909 dated Mar. 29, 2021, 15 pages, English translation of ISR only.

* cited by examiner

CONTACT PIN WITH INDIVIDUALLY MOVABLE CONTACT ELEMENTS

CROSS-REFERENCE TO RELATED APPLICATION

This application is a continuation of International Application No. PCT/EP2020/086909, filed Dec. 17, 2020, which claims priority to German Patent Application No. 10 2019 220 311.6, filed on Dec. 19, 2019. The contents of each of the which are hereby incorporated by reference in their entirety into the present disclosure.

DESCRIPTION

The invention relates to a contact device for contacting an electrical contact point of a test object, comprising a contact plunger, which has a plunger shaft for mounting in a guide sleeve in an axially displaceable manner as well as a contact head which is assignable to the test object and arranged on a free end of the plunger shaft, and comprising at least one contact element, which is movably mounted on and/or in the contact head, whereby at least one spring element, which is elastically deformable against its spring force by means of the contact element under a load resulting from a contact, is assigned to the contact element.

Contact devices of the above-mentioned type are known from the prior art. Spring contact pins, which have a guide sleeve and a plunger-shaped contact element, which is mounted in the guide sleeve in a displaceable manner, are often used for contacting test objects. In addition, a spring element, which pushes the contact element out of the guide sleeve, is arranged in the guide sleeve, so that the contact element can be pushed into the guide sleeve against the force of the spring element during a contacting. The axial displaceability of the contact element has the advantage that, when using a plurality of contact devices of this type in a contact head of a test device, it is ensured that all contact points for testing the test object are contacted. As a result of the contacting, an electrical connection to the test object is established, by means of which the test object can be tested electrically with regard to its functionality. For this purpose, an electrical voltage and/or an electrical current is applied, for example, to the test object at one of the contact points by means of a contact device, and the reaction of the test object on the application is monitored electrically at another one of the contact points of the test object.

The invention is based on the object of creating an improved contact device, which also allows for a safe contacting of large-area contact points, even if they are formed in an uneven manner.

The object on which the invention is based is solved by means of a contact device comprising the features as disclosed herein. This contact device has the advantage that the contact head advantageously adapts to the contact point of the test object, wherein the contact device can be produced with technically simple means and thus cost-efficiently. The invention is characterized in that several of the contact elements, which in each case have a contact area for contacting, are arranged next to one another on the contact head in such a way that, together, the contact areas form an at least essentially continuous contact surface of the contact head for the contact point in the unloaded state. The contact head thus has a plurality of contact elements, which form a closed or virtually closed contact surface in the unloaded state. For this purpose, each contact element has a contact area, which faces the test object or which faces away from the contact head, respectively, wherein the contact areas extend in particular in one plane, and that each contact area on its own provides an at least essentially flat bearing surface for the test object as well as the contact point of the test object. In the unloaded state of the contact elements, these contact areas lie in a common plane, so that the contact surface of the contact head is formed. If the contact device with the contact head is now fed to the test object, so that the contact elements impinge on a contact point, the contact elements deflect independently of one another against the force of the respective assigned spring element, so that the contact surface of the contact head as whole adapts to the surface of the contact point. As already mentioned, a safe and also large-area contacting of the contact point is ensured thereby, even in the case of an uneven formation of the contact point.

According to a preferred further development of the invention, at least some of the contact elements for forming a ring-shaped contact surface in each case form a ring segment surface with its contact area. The contact areas of the contact elements are thus designed in such a way that at least some of the contact areas form ring segment surfaces. As a result, at least some of the contact elements are arranged in a ring-shaped manner on the contact head. The ring shape results in an advantageous contacting of the contact point of the test object.

The contact surface preferably has a circular, oval, or polygonal contour in particular outer contour. The contact surface is thus not limited to a circular formation, but can also be formed in an oval or polygonal manner. A mixture of a circular shape, oval shape, and polygonal shape is also conceivable. The contact surface is thereby advantageously adapted in its outer contour or shape to the contact point, which is to be tested, of a test object. A ring-shaped formation of the contact surface is possible in any case, wherein, according to a further embodiment, a disk-shaped formation of the contact surface is also preferred, so that a surface, which is closed as a whole, results.

The contact areas of the contact elements particularly preferably form circular segment surfaces of the contact surface. The contact areas are thus in each case formed in a wedge-shaped manner and point with their pointed ends to a center of the contact head or of the contact surface, respectively, An advantageous division of the contact surface into individual segments is thus ensured.

It is furthermore preferably provided that each contact element is held on the contact head only by means of the respective assigned spring element. Further guide means can thus be forgone. On the one hand, the spring element thus forms the holding and guide element for the contact element, and, on the other hand, provides the above-described spring force, which allows for a shifting of the contact element during contacting. The spring element is in particular formed in such a way that the contact element can deflect axially or in the longitudinal extension of the contact plunger, respectively. According to a first embodiment, the spring element is formed in such a way that the contact element can only deflect axially. According to a further embodiment, the spring element is formed for the purpose that the contact element can deflect axially and can additionally tilt or pivot. A particularly advantageous adaptation of the contact surface of the contact head to the contact point of the test object is attained thereby.

The respective contact element is preferably arranged as ring segment section in a plane transversely, in particular perpendicularly to the longitudinal extension of the plunger, spaced apart from the contact head. The respective contact element thus has an axial distance from the contact head, so that a deflection in the direction of the contact head is ensured.

The respective ring segment is in particular formed as flat ring segment, so that a large spring deflection results in the case of a low construction height.

It is furthermore preferably provided that the respective spring element is fastened to the contact element on one end and to the contact head on the other end, and is formed so as to run transversely at least section by section with respect to the longitudinal extension of the plunger. Due to the transverse course, in particular obliquely or perpendicularly to the longitudinal extension of the plunger, it is attained that the spring element allows for the desired shifting of the respective contact element by means of an elastic bending. The spring element is in particular formed in such a way that an at least essentially axial shifting, thus a shifting in the longitudinal extension of the plunger, is ensured, during which the contact element itself at least essentially maintains its alignment transversely to the longitudinal extension of the plunger.

The spring element particularly preferably has a curved course from the contact head to the contact section, so that the course is formed transversely or obliquely to the longitudinal extension of the plunger by means of the curvature. By means of the curved course, the spring stiffness of the spring element is further influenced, for example reduced. In the alternative the spring element as a whole runs along a straight line from the contact head to the contact element, whereby an elastic deformability is likewise ensured.

The spring section is particularly preferably formed so as to run in an S-shaped manner, in order to provide for an advantageous elasticity, which also allows for a pivoting or tilting of the respective contact element during the deflection, so that the further improved adaptation of the contact surface as a whole to the contact point of the test object is made possible.

According to a preferred further development of the invention, the spring element is connected to the contact element on an outer edge of the contact element. As a result, in particular the section of the contact element located farther on the inside can be shifted particularly easily in the direction of the plunger, so that an advantageous adaptation of the contact surface as a whole, in particular also an encompassing of a contact point, which protrudes from the test object, is made possible from several sides.

The spring element is advantageously formed in such a way that, starting at the outer edge of the contact element, it is aligned so as to run to the contact head in the direction of the inner edge of the contact element. The end of the spring element assigned to the contact head thus lies farther on the inside of the contact head than the end assigned to the contact element, whereby an advantageous spring deflection as well as an advantageous shifting of the contact element and thus an advantageous adaptation of the contact surface results.

The spring element is particularly preferably formed in one piece with the contact element and/or with the contact head. This results in an integral formation in particular also of the contact element with the contact head. In the case of a formation of contact element, spring element, and contact head in one piece as a whole, an advantageous manufacturability by means of conventional 3D metal printing methods is ensured.

It is furthermore preferably provided that the free ends of the contact elements pointing to the inside end spaced apart from one another in order to form a passage opening. On the one hand, the ring shape of the contact surface is defined thereby, by means of which a hooking or jamming of contact elements located opposite one another with one another during contacting is prevented, and it is made possible thereby on the other hand that at least one further sensor or at least one further contact element, which is advantageous for performing a test on the test object, can be arranged in the region of the passage opening. The distance of the contact elements from one another on their ends facing one another also allows that the contact elements can be shifted under elastic deformation of the spring element without canting or jamming.

The respective spring section is preferably formed in a lamellar manner at least section by section in its longitudinal extension. The elasticity of the respective spring element is thus increased and weight is saved. The lamellae run in particular parallel to one another and are separated from one another by means of a respective longitudinal slit in the spring element. The spring element is in particular formed in a strip-shaped manner for this purpose.

The contact head furthermore preferably has a support element, which runs parallel to and spaced apart from the respective spring element, for limiting a movement path of an assigned contact element. The respective contact element can thus be shifted elastically only maximally up to the support element. On the one hand, an over-stressing of the respective spring element is thus avoided, and on the other hand, an advantageous guidance and alignment of the respective contact head is ensured. The respective support element is preferably likewise formed in an electrically conductive manner, so that it serves as additional current path as soon as the respective spring element and/or contact element abuts on the support element. The respective support element is particularly preferably made of the same material as contact element and/or spring element. In the extreme case, the only current path from the test object to the test device can be formed by means of the respective support element, whereby the contact head would operate as in the case of a classic spring contact pin rod or plastically adaptively, respectively. The support elements in particular in each case have a separate bending-restricting structure and preferably act as thermal ground conductor and heat sink. According to a preferred embodiment, contact element, spring element, and corresponding support element are formed in such a way that the contact element can deflect to such an extent that the support element comes into direct abutment with the test object, whereby a current bypass is established by means of the respective support element.

The contact head preferably has a trough-shaped, in particular V-shaped receptacle, in which the spring elements and optionally also the contact elements are arranged. By means of the trough-shaped receptacle, the support element for the spring elements or contact elements, respectively, is formed in particular by means of the side wall of the receptacle. The side wall of the receptacle is in particular formed in a continuous manner, viewed in the circumferential direction, so that a common support element for all spring elements and/or contact elements is present in a simple manner. By means of the arrangement of the spring elements within the receptacle, it is furthermore ensured that said spring elements are protected against external influences and in particular against damages caused by unexpected force effects.

It is furthermore preferably provided that the contact areas of the contact elements in each case have a surface structure having contact tips. By means of the contact tips on the respective contact area, an advantageous electrical contacting of the test object or of the respective contact point of the test object, respectively, is ensured. The contact tips, together with the shifting of the respective contact element by means of the spring element in particular have the result that the contact tips scratch the contact point of the test object during the shifting of the contact element. The contact elements can in particular not only be shifted axially, but they are also displaced transversely or radially, respectively, during the deflection by means of the advantageous formation of the spring element, as already mentioned above. The contact tips thus scratch on the surface of the contact point, whereby, for example, a corrosion protection layer of the contact point is penetrated and a safe electrical connection to the test object is established. The respective surface structure is particularly preferably formed as pyramid structure, which in each case has a plurality of contact tips. The contact tips are preferably formed to be so hard and pointed that they can scratch the counter contact or the contact point of the test object, respectively, on the surface.

It is furthermore preferably provided that at least one sensor pin or contact pin is arranged on the contact head in such a way that a free end of the sensor pin or contact pin is assigned to the passage opening. This provides for additional sensing means and/or contact means, which expands the functionality of the contact device and of a test device having the contact device. The additional sensing means in particular have at least one temperature sensor for detecting a temperature of the contact head and/or of the test object.

In addition, the contact head particularly preferably has at least one coolant duct. A coolant, in particular a liquid or gaseous cooling medium, by means of which heat can be carried away or dissipated, respectively, from the contact head, can preferably be conveyed through the coolant duct. Due to the fact that high currents partially also flow through the contact head or at least through the contact elements of the contact head during the test operation, it is attained by means of the advantageous cooling option that an overheating of the contact head and/or of the contact elements during operation is safely prevented.

The coolant duct is preferably guided through the support section or the support sections, respectively, to the contact elements. The coolant duct thus lies close to the contact elements, and heat is transported, for example, from the contact elements into the respective support section, and from there into the coolant duct and the cooling medium conveyed thereby. The advantageous alignment of the support sections parallel to the spring elements and/or contact elements in the unloaded state is also advantageous thereby because a large-area heat transfer into the cooling medium is ensured thereby.

For each contact element, the coolant duct particularly preferably has at least one through-flow opening, which is assigned to the respective contact element. This is advantageous in particular when a gaseous cooling medium, which then impinges directly on the contact elements and/or spring elements, is conveyed through the coolant duct, in order to ensure an advantageous heat dissipation. The respective through-flow opening is particularly preferably formed in such a way that the outflowing cooling medium flows off in the direction of the test object, so that it also attains a cooling effect on the test object.

In the alternative or in addition, the contact head as a whole, but at least the coolant duct, the support element, or the support elements is made of a porous material, at least in the region of a spring element and/or contact element, through which a gaseous medium can flow out of the coolant duct in the direction of the contact elements and/or spring elements. Concrete through-flow openings can thus be forgone, which simplifies the production of the contact device as a whole. A sufficient cooling of the contact elements or of the contact head as a whole is thus nonetheless attained.

It is furthermore preferably provided that the plunger shaft is guided in a guide sleeve, wherein a further spring element is arranged between the pin sleeve and the contact head so that it can be axially biased or is biased. It is attained thereby that the plunger or the contact head, respectively, can be shifted axially as a whole relative to the guide sleeve, in order to ensure in particular in the case of an application, in which a plurality of contact devices of this type are arranged in a test head, because all contact points are electrically contacted safely.

The test head according to the invention comprising the features characterized in that it carries a plurality of the contact devices, which are formed according to the invention. The already mentioned advantages result thereby.

Figure 2:
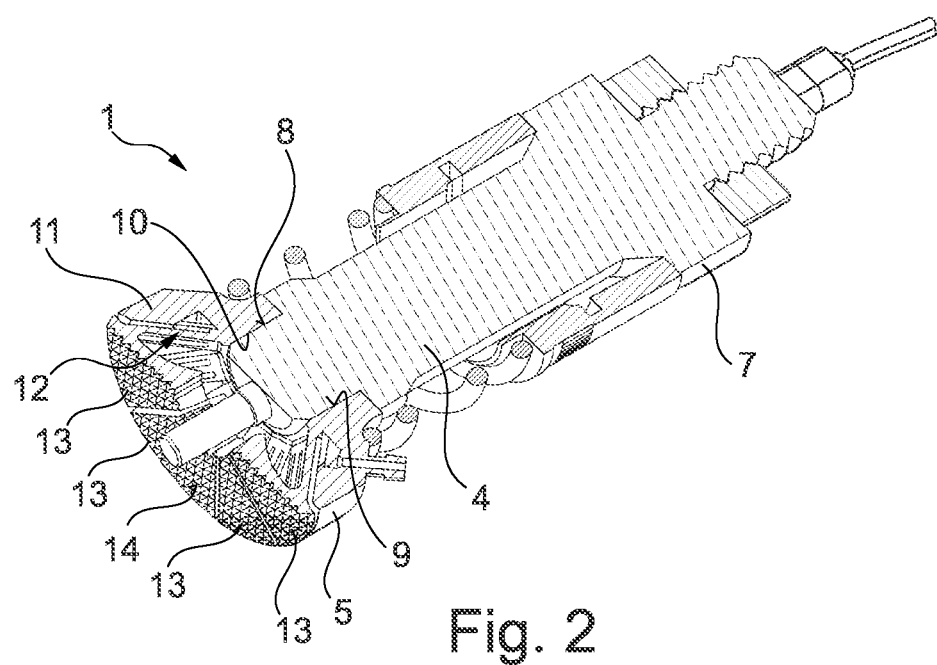
Figure 3A:
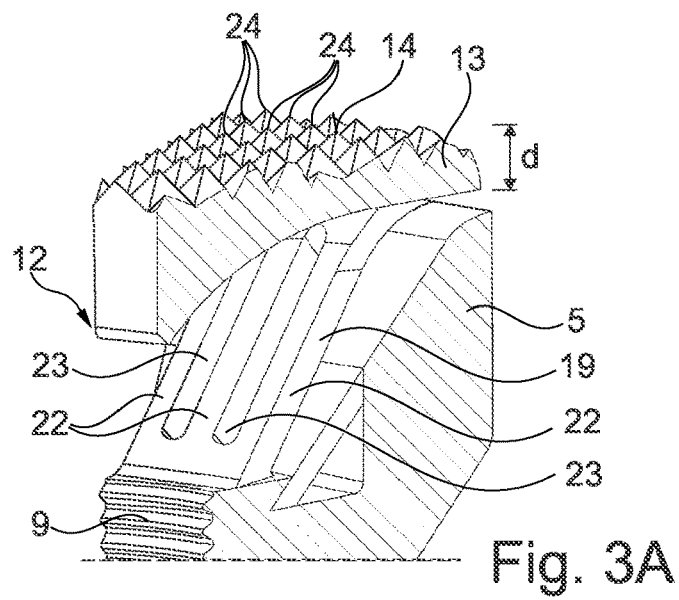
Figure 3B:
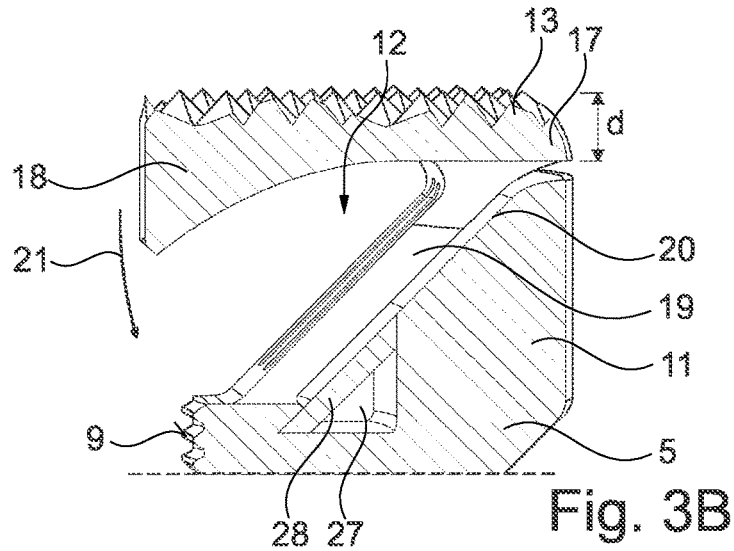
Figure 4:
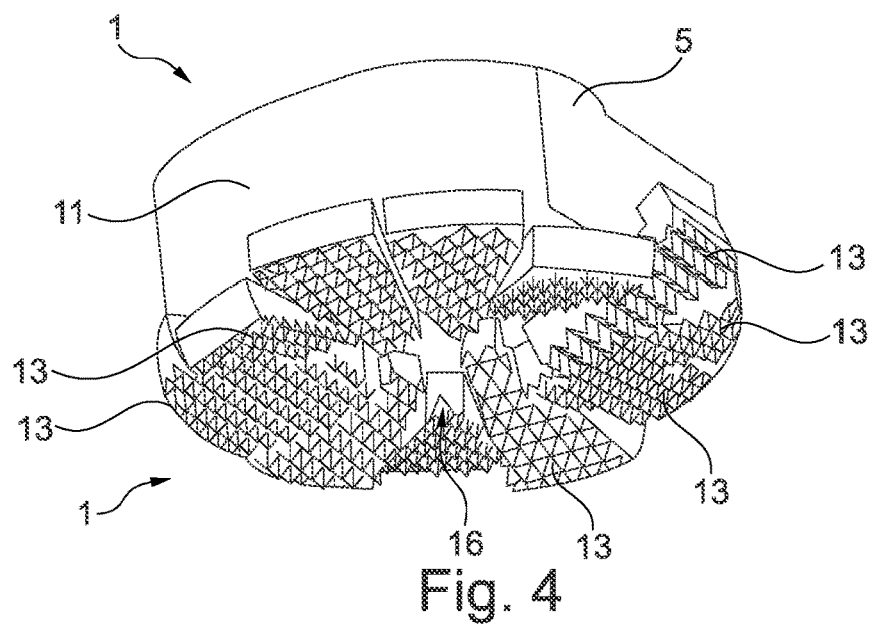
Figure 5:
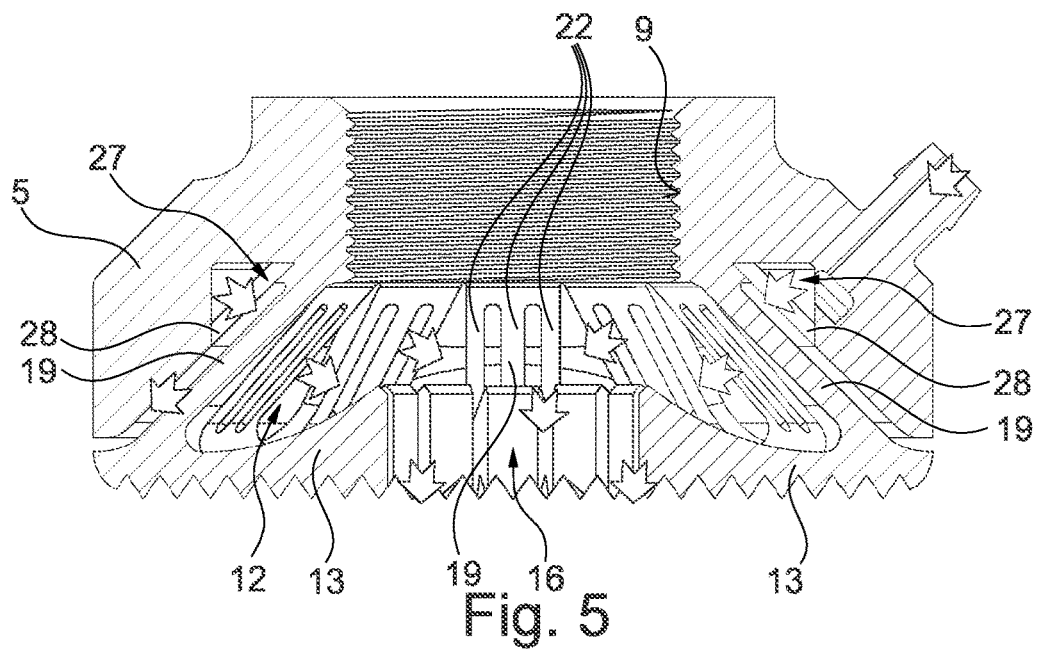
Figure 6:
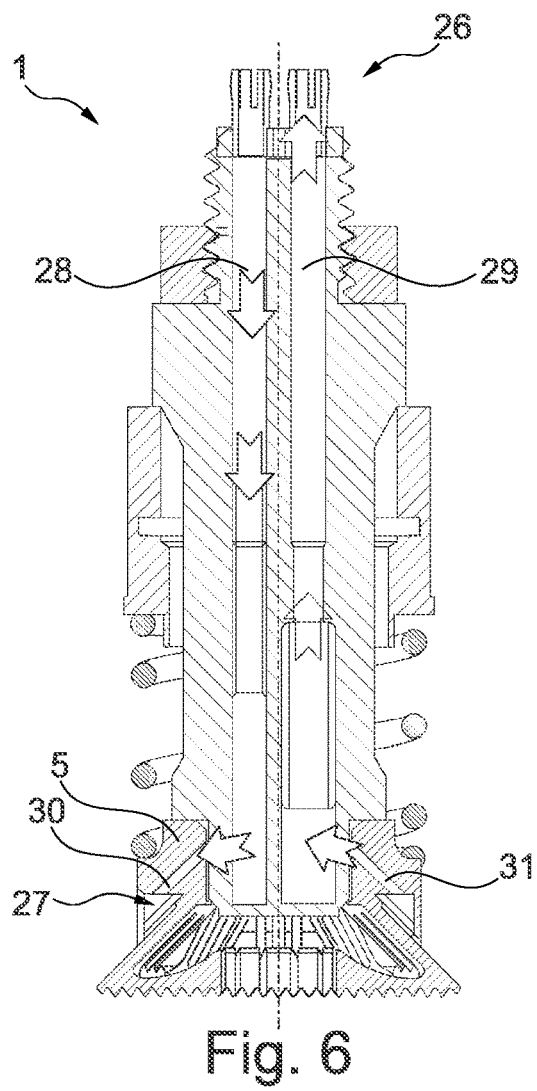

The invention will be described below in more detail on the basis of the drawings, for the purpose of which FIG. 1 shows an advantageous contact device in a perspective illustration, FIG. 2 shows the contact device from FIG. 1 in a longitudinal sectional illustration, FIGS. 3A and 3B show a detail sectional illustration of the contact device, FIG. 4 shows a top view onto a contact head of the contact device in the loaded state, FIG. 5 shows an enlarged longitudinal sectional illustration of the contact device comprising an advantageous cooling device, and FIG. 6 shows a longitudinal sectional illustration of the contact device comprising a version of the cooling device.

FIG. 1 shows an advantageous contact device 1, which can be arranged on a test head for performing a test on an electrical/electronic test object, in a simplified perspective illustration. The contact device 1 has a guide sleeve 2, which can be fastened to the test head. A contact plunger 3 is mounted in the guide sleeve 2 in an axially displaceable manner. For this purpose, the contact plunger 3 has a plunger shaft 4, which is mounted in the guide sleeve 2 in an axially displaceable manner, as well as a contact head 5. The contact head 5 is thereby arranged on an end of the plunger shaft 4 protruding from the guide sleeve 2. The contact head can be formed in one piece with the plunger shaft 4, or, as will be described in more detail below, is fastened, in particular screwed, as separate component to the contact pin 4. The contact head 5 has an outer diameter, which is larger than the outer diameter of the plunger shaft 4, the outer diameter of the contact head 5 is in particular at least as large as the outer diameter of the guide sleeve 2. A spring element 6 is held between the contact head 5 and the guide sleeve 2 in an axially biased manner. In the present exemplary embodiment, the spring element 6 is formed as coil spring, which is arranged coaxially to the plunger shaft 4, and which abuts on the rear side of the contact head 5 facing the guide sleeve 2 on one end and on the front side of the guide sleeve 2 facing the contact head 5 on the other end. The plunger shaft 4 furthermore has an axial stop, which cooperates with the guide sleeve 2 in such a way that the contact plunger 3 cannot be pushed out of the guide sleeve 2 by means of the spring element 6.

FIG. 2 shows the contact device 1 in a simplified longitudinal sectional illustration for this purpose. On its end facing away from the contact head 5, the plunger shaft 4 has a radial protrusion 7, which forms the above-mentioned axial stop. For this purpose, the radial protrusion 7 has an outer diameter, which protrudes beyond the guide sleeve 7 at least in some regions, so that it axially bears on the guide sleeve in the unloaded state by means of the biassing force of the spring element 6, as shown in FIGS. 1 and 2.

According to the present exemplary embodiment, as can in particular be seen in FIG. 2, the contact head 5 is screwed onto the plunger shaft 4. For this purpose, the screw shaft 4 has, on its end facing away from the guide sleeve 2, an external thread 8, which cooperates with an internal thread 8 of the contact head 5.

According to the present exemplary embodiment, the contact head 5 is formed in one piece and is produced, for example, by means of a 3D metal printing method.

The contact head 5 is formed at least essentially in a trough-shaped manner, wherein the internal thread 9 is formed in a passage opening 10 in the base of the contact head 5.

A side wall extending over the entire circumference of the contact head 5 protrudes from the base, wherein, at least on its inner side, the side wall is aligned obliquely or at an incline, respectively, to the axial longitudinal extension of the contact plunger 3, and thus also obliquely to the base, which is aligned transversely to the longitudinal extension of the contact plunger 3. The side wall 11, together with the base, thus forms a trough-shaped receptacle 12, to which several contact elements 13 are assigned. According to the present exemplary embodiment, the contact elements 13 are formed in a circular segment-shaped manner, so that they in each case have a circular segment-shaped contact area, which, in the unloaded state, as shown in FIGS. 1 and 2, lie in a common plane perpendicularly to the longitudinal extension of the plunger shaft and on the side of the contact head 5 facing away from the plunger shaft 4. Together, the contact areas 14 form a contact surface 15 of the contact head 5, which, according to the present exemplary embodiment, is formed in a circular ring-shaped manner. On their ends facing one another, the contact elements 13 end spaced apart from one another, so that a passage opening 16 remains in the center of the contact head 5 or of the contact surface 15, respectively.

In each case in a detail sectional illustration, FIGS. 3A and 3B show one of the contact elements 13 in two different views, for description of the arrangement of the contact elements on the contact head 5. As already mentioned, the contact elements 13 are formed in a circular segment-shaped manner. In the side view shown in FIGS. 3A and 3B, it can additionally be seen that the contact elements are formed in an essentially plate-shaped manner, wherein, according to the present exemplary embodiment, a thickness d of the contact elements 13 increases from their respective outer edge 17 to the inner edge 18, which is assigned to the center, so that the contact elements 13 are in each case formed in a wedge-shaped manner, and with a thickness increasing to the inside.

A spring element 19 is in each case fastened to the outer edge 17 of the respective contact element 13. According to the present exemplary embodiment, the spring elements 19 are formed as spring strips, which run in a straight line, which are fastened to the outer edge of the respective contact element 13 on the one end, and to the base of the contact head 5 on the other end. The spring elements 19 are in particular formed in one piece with the contact element 13 as well as with the base of the contact head 5. As already mentioned, a 3D printing method lends itself for this purpose.

The spring elements 19 and the obliquely running inner side of the side wall 11 run parallel to one another, as can be seen, for example, in FIG. 3B. The respective spring element 19 thereby lies spaced apart from the inner side of the side wall 11, so that a free space remains between them. The inner side of the side wall 11 now serves as support element 20 for the respective spring element 19. The support element 20 limits the movement path of the spring element 19 in the direction of the contact head 5 or in the direction of the base of the contact head 5, respectively. The smaller the distance between the spring element 19 and the support element 20 in the unloaded state, the smaller is the axial deflection depth of the contact element 13 as a whole as well. The internal free end of the respective contact element 13, thus the inner edge 18, however, can be shifted farther to the inside than the outer edge, as indicated by means of an arrow 21 in FIG. 3B. The respective contact element 13 can thus axially deflect farther on the inner edge 18 than on the outer edge, whereby an inclined position of the respective contact element 13 in the unloaded state can result as well.

The spring elements 19 are optionally formed in a lamellar manner, as shown in FIGS. 3A and 3B. In at least one longitudinal section, they have several, in the present case in each case three, lamellae 22 for this purpose, which are arranged spaced apart from one another, wherein two adjacent lamellae 22 are in each case separated from one another by means of a longitudinal section 23 located therebetween.

As additionally shown in the enlarged illustrations of FIGS. 3A and 3B, the respective contact area 14 is provided with a surface structure having contact tips 24. According to the present exemplary embodiment, the surface structure is formed as pyramid structure. The contact tips ensure that the contact point of a test object, which is to be contacted, is scratched during the shifting of the respective contact element 13, whereby, for example, a corrosion protection layer is penetrated, and the electrical contact to the contact point is established safely.

FIG. 4 shows a perspective illustration of the contact head 5 in the operated state, thus when the contact head 5 is pushed with the contact elements against a contact point of a test object (not shown here). The contact elements 13 deflect to different extents into the receptacle 12, independently of one another, depending on how the contact point of the test object is formed. In particular unevennesses of the contact point as well as three-dimensionally formed contact points are thus contacted safely by means of the contact device 1. The test device 1 is thus formed as one-duct test device in this case because it only has one electrical contact path.

Due to the advantageous formation as ring segments, the contact elements 13 ensure that they do not collide with one another during the deflection, and also do not get jammed on one another, or cant, so that a safe operation of the contact device 1 is ensured at any time. The contact head 5 as well as the plunger shaft 4 are preferably made of an electrically conductive material, so that an electrical connection by means of the test device 1 is ensured directly through the contact elements 13 and the contact plunger 3. The contact plunger 3 optionally carries a further, for example, needle-shaped contact element 25, as shown in FIG. 1, and/or a sensor element 26, which are in each case assigned to the passage opening 16 in the contact surface 15, wherein the contact element 25 and/or the sensor element 26 can protrude, for example, as shown in FIGS. 1 and 2, from the contact surface 15 in the unloaded state of the contact device 1. A multi-duct formation of the test device 1 can thus also be attained.

The contact device 1 is furthermore preferably formed for high current applications. On the one hand, this provides for the large contact surface 15, which ensures an advantageous electrical connection to a contact cross sectional area, which is large as a whole. The contact device 1 furthermore has a cooling device 26, by means of which in particular the contact elements 13 can be cooled during operation. It is thus avoided that the electrical resistance of the contact device increases due to an increasing heat development during operation and, on the other hand, that the mechanical properties of the test device 1 are not impacted during operation.

For this purpose, the optional cooling device 26 has in particular a coolant duct 27, which is assigned to the contact head 5. According to the present exemplary embodiment, the coolant duct 27 extends through the side wall 11 at least essentially over the entire circumference of the contact head 5. The coolant duct 27 can thereby be formed directly integrally in the contact head 5, or by means of a depression, which is closed by a cover 28, on the inner side of the side wall 11, as shown in an exemplary manner in FIGS. 3A and 3B.

The wall section of the coolant duct 27, which is assigned to the spring elements 19 and which can also be formed as separate cover 28, is advantageously made of a porous or gas-permeable material, respectively. If a gaseous coolant is applied to the coolant duct 27, said gaseous coolant can flow through the porous wall to the spring elements 19 and thus to the contact elements 13, as shown by means of arrows in enlarged longitudinal sectional illustrations of the contact head 5 in FIG. 5. The lamellar formation of the spring elements 19 thereby also has an advantageous effect.

In the alternative, the coolant duct 27 has one or several through-flow openings, through which the gaseous cooling medium can reach into the receiving space 12 of the contact head 5.

If a fluid cooling with a liquid medium is provided instead of a gas cooling, the contact plunger 3 advantageously has an inlet duct 28 and an outlet duct 29. For this purpose, FIG. 6 shows an advantageous further development of the test device 26 in a simplified longitudinal sectional illustration. The liquid cooling medium is conveyed through the inlet duct 28 through an access opening 30 formed in the contact head 5 into the coolant duct 27. The liquid cooling medium, which is heated up in the contact head 5, is returned again through an outlet opening 31 of the contact head 5, which is coupled fluidically to the coolant duct 27 on the one side and the outlet line 29 on the other side, for example to a cooling device, which prepares or cools, respectively, the cooling medium for a further passage of the contact head 5.

The invention claimed is:

1. A contact device (1) for contacting an electrical contact point of a test object, comprising a contact plunger (3), which has a plunger shaft (4) for mounting in a guide sleeve (2) in an axially displaceable manner as well as a contact head (5) which is assignable to the test object and arranged on a free end of the plunger shaft (4), and comprising at least one contact element (13), which is movably mounted on and/or in the contact head (5), whereby at least one spring element (19), which is elastically deformable against its spring force by means of the contact element (13) under a load resulting from a contact, is assigned to the contact element (13), wherein several of the contact elements (13), which in each case have a contact area (14) for contacting, are arranged next to one another on the contact head (5) in such a way that the contact areas (14) form an at least essentially continuous contact surface (15) of the contact head (5) for the contact point in the unloaded state, characterized in that the respective spring element (19) is formed as a spring strip, which runs in a straight line, which is fastened to the respective contact element (13) on one end and to the contact head (5) on the other end, and is formed so as to be at least sectionally aligned obliquely with respect to a longitudinal extension of the contact plunger (3).

2. The contact device according to claim 1, characterized in that at least some of the contact elements (13) for forming a ring-shaped contact surface (15) in each case form a ring segment surface with its contact area (14).

3. The contact device according to claim 1, characterized in that the contact surface (15) has a circular, oval, or polygonal outer contour.

4. The contact device according to claim 1, characterized in that the contact areas (14) form circular segment surfaces of the contact surface (15).

5. The contact device according to claim 1, characterized in that each contact element (13) is held on the contact head (5) only by means of the respective assigned spring element (19).

6. The contact device according to claim 1, characterized in that the respective contact element (13) is aligned as ring segment in a plane transversely, in particular perpendicularly to the longitudinal extension of the contact plunger (3).

7. The contact device according to claim 1, characterized in that the spring element (19) is connected to the contact element (13) on an outer edge (17) of the contact element (13).

8. The contact device according to claim 1, characterized in that the spring element (19) extends from the outer edge (17) of the contact element (13) in the direction of the inner edge (18) of the contact element (13).

9. The contact device according to claim 1, characterized in that the spring element (19) is formed in one piece with the contact element (13) and/or with the contact head (5).

10. The contact device according to claim 1, characterized in that the free ends of the contact elements (13) pointing to the inside end spaced apart from one another in order to form a passage opening (16).

11. The contact device according to claim 1, characterized in that the respective spring element (19) is formed in a lamellar manner at least section by section in its longitudinal extension.

12. The contact device according to claim 1, characterized in that the contact head (5) has at least one support element (20), which runs parallel to and spaced apart from the respective spring element (19), for limiting a movement path of the corresponding contact element (13).

13. The contact device according to claim 1, characterized in that the contact head (5) has a trough-shaped receptacle (12), in which the contact elements (13) are arranged.

14. The contact device according to claim 1, characterized in that the contact areas (14) of the contact elements (13) have a surface structure, in particular a pyramid structure, having contact tips (24).

15. The contact device according to claim 1, characterized in that at least one sensor pin (26) and/or contact pin (25) is arranged on the contact head (5) in such a way that a free end of the sensor pin (26) and/or contact pin (25) is guided through the passage opening (16).

16. The contact device according to claim 1, characterized in that the contact head (5) has at least one coolant duct (27).

17. A test head for performing electrical tests on electrical/electronic test objects, comprising a plurality of contact devices according to claim 1.

* * * * *